United States Patent [19]

Lindenmeier et al.

[11] Patent Number: 4,653,116
[45] Date of Patent: Mar. 24, 1987

[54] DETECTOR FOR INDICATING FREQUENCY DEVIATION PEAKS

[75] Inventors: Heinz Lindenmeier, Planegg; Ernst Manner; Gerhard Flachenecker, both of Ottobrunn, all of Fed. Rep. of Germany

[73] Assignees: U.S. Philips Corporation, New York, N.Y.; Hans Kolbe & Co., Bad Salzdetfurth, Fed. Rep. of Germany

[21] Appl. No.: 693,800

[22] Filed: Jan. 23, 1985

[51] Int. Cl.$^4$ .................... H04B 1/10; H04B 17/00
[52] U.S. Cl. .................................. 455/205; 455/226; 455/312; 455/296
[58] Field of Search ............... 455/52, 65, 135, 296, 455/297, 303, 205, 226, 311, 312, 214; 381/10, 11, 13; 324/57 DE, 57 N

[56] References Cited

U.S. PATENT DOCUMENTS

| | | | |
|---|---|---|---|
| 3,869,673 | 3/1975 | Close | 455/303 |
| 4,245,352 | 1/1981 | Karpowycz et al. | 455/226 |
| 4,254,505 | 3/1981 | Bossert | 455/303 |
| 4,498,195 | 2/1985 | Ooi et al. | 455/303 |

FOREIGN PATENT DOCUMENTS

| | | |
|---|---|---|
| 3107970 | 2/1982 | Fed. Rep. of Germany . |
| 3122057 | 4/1982 | Fed. Rep. of Germany . |
| 0162144 | 9/1983 | Japan ........................ 455/303 |

Primary Examiner—Jin F. Ng
Attorney, Agent, or Firm—Michael J. Striker

[57] ABSTRACT

A detector for indicating reception disturbances during ultrashort wave broadcast reception by demodulating of intermediate frequency signals has a frequency modulated demodulator with a demodulation characteristic line formed so that a controlling region within which the output signal increases with increasing frequency deviation from a carrier frequency extends advantageously over the entire band width of the ultrashort wave intermediate frequency channel and is significantly greater than the maximum frequency deviation of the intermediate frequency carrier modulated with the basic band signal in the frequency, and the output signal of the frequency demodulator is supplied to an evaluating circuit at whose output the exceeding of a predetermined frequency disturbance deviation threshold is indicated by a logic signal.

23 Claims, 9 Drawing Figures

DETECTOR FOR INDICATING FREQUENCY DEVIATION PEAKS

BACKGROUND OF THE INVENTION

The present invention relates to a detector for indicating the reception disturbances during ultrashort wave broadcast reception by the modulation of the intermediate frequency signal. Such detectors are used, for example, for improvement of broadcast reception in power vehicles. The detector has an object to recognize and indicate a reception disturbance. For this purpose a shift operation is introduced which is generally carried out electronically. For example, the Offenlegungschrift DE No. 3,107,970 A1 describes an FM receiver in which the multipath noise is avoided with the aid of a detector and a shifting device. In the Offenlegungschrift DE No. 3,122,057 A1 a tuner control with a detector for detecting the signal level is provided in a broadcast receiver. Moreover, the U.S. Pat. No. 3,825,697 discloses a shifting device which after recognition of the disturbance because of the multipath reception shifts from stereo operation to mono operation. In all above described cases a detector for recognition of the disturbance is required.

A detector for recognition of disturbances is also known from the U.S. Pat. No. 4,216,353. This detector is especially designed for recognition of disturbing multipath propagation of the electromagnetic waves with greatly different transit times. As a result of this effect, an increased noise and a distortion of the low frequency communication takes place at the output of the frequency demodulator. In the case of the stereo transmission this fact also results in an increased cross-talk between both stereo channels. The detector described in this patent is based on the evaluation of the amplitude-time behavior of the frequency demodulated signal available at the reception side. This detector has, in the sense of its use in an automobile receiver, the following disadvantages. It is known that superposition of partial waves at the reception point in the event of transit time differences between 1 $\mu$s and 100 $\mu$s leads to significant distortions of the low frequency communication at the outlet of the FM demodulator. This distortion passes, together with an amplitude modulation of the resulting high frequency carrier, that depends on the low frequency communication content, to the reception point. The detector disclosed in the U.S. Pat. No. 4,216,353 recognizes these amplitude modulations and indicates them as disturbances. However, the wave field is in most instances assembled of partial waves whose transit time differences lie below 1 $\mu$s. This superposition of the partial waves does not lead to disturbances at the reception side, but causes a strong dependence of the resulting field amplitude on the reception location. The input level of the automobile receiver experiences therefore by the own movement of the vehicle in this wave field, a time-dependent amplitude change which appears as amplitude modulation. The above described detector therefore possesses the disadvantage in that it must distinguish between an amplitude demodulation type which does ot lead to disturbances and another amplitude demodulation type which results from multipath propagation with large transit time differences and, therefore, causes disturbances. This situation is especially difficult because both modulation types take place statistically and chronologically in a simultaneous manner. This results in an unreliable recognition of the actual disturbance and a relatively great detection time. This long detection time leads to a situation where the tuning in the reception system by switching can be carried out only so late that the broadcast listener has already sensed the disturbance.

SUMMARY OF THE INVENTION

Accordingly, it is an object of the present invention to provide a detector for indicating frequency deviation peaks, which avoids the disadvantages of the prior art.

More particularly, it is an object of the present invention to provide a detector for indicating frequency deviation peaks in which the occurrence of reception disturbances taking place during ultrashort wave stereo or mono reception and especially caused by multipath reception with pronounced transit time differences of the superposed waves can be recognized and indicated fast and accurately.

In keeping with these objects and with others which will become apparent hereinafter, one feature of the present invention resides, briefly stated, in an detector which has a FM demodulator whose demodulation characteristic line is designed so that a control region within which an output signal increases with increasing frequency deviation from a carrier frequency (intermediate frequency signal) extends advantageously over the entire band width of the ultrashort wave intermediate frequency channel and in any case is significantly greater than the maximum frequency deviation of the intermediate frequency carrier modulated with the baseband signal in the frequency, and the output signal of the frequency demodulator is supplied to an evaluating circuit with an output at which the excess of a suitably provided frequency deviation threshold is indicated by a logic signal.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

FIG. 6 is a view showing a chain circuit of differentiating members shown in

FIG. 5 as a further embodiment of the circuit for increasing the steepness of the pulse flanks;

DESCRIPTION OF THE PREFERRED EMBODIMENTS

Figure 1:
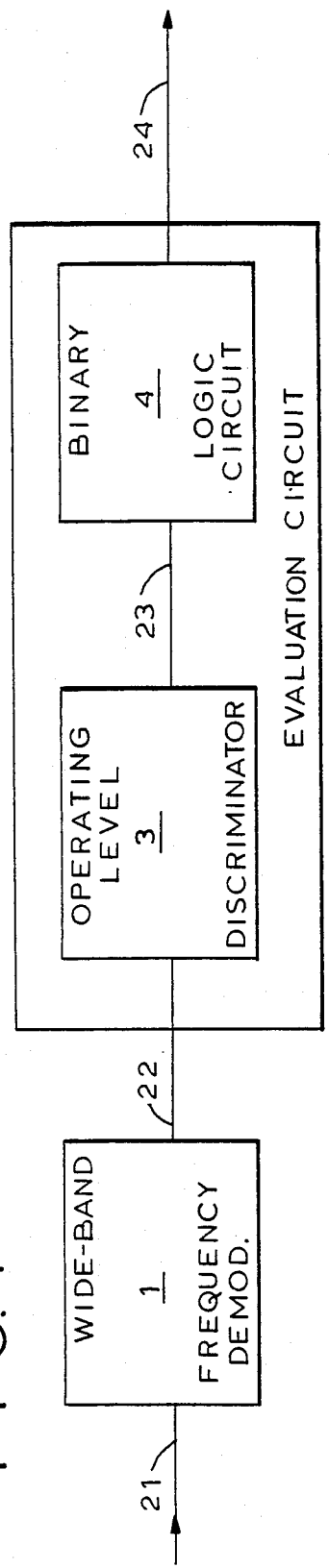
FIG. 1 is a view showing a detector in accordance with the present invention.
Figure 2:
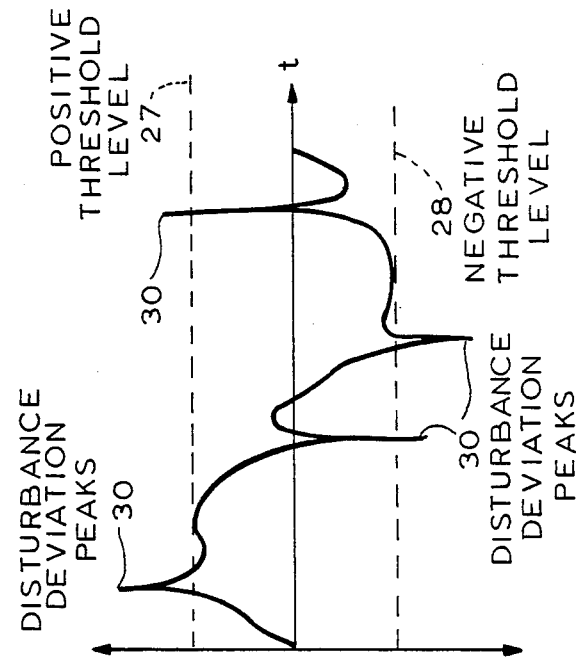
FIG. 2 is a view showing a demodulation characteristic line of a wide band operating (FM) frequency demodulator with a control region.
Figure 3:
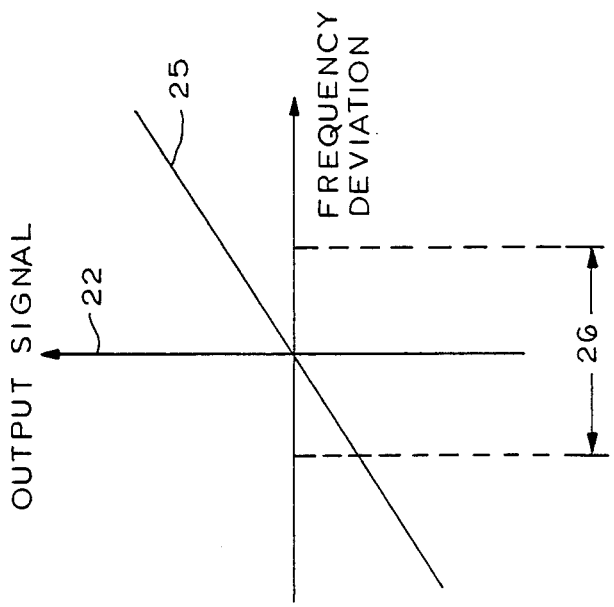
FIG. 3 is a view showing a frequency deviation with disturbance frequency peaks of a signal distorted by a multipath propagation (great transit time difference)

FIG. 1 shows a detector in accordance with the present invention. The frequency deviation of the received signal is shown in FIG. 3 and is formed of two superposed partial waves with great transit time difference. Frequency disturbance deviation peaks or pulses 30 as shown in FIG. 3 are produced by the modulation content of the frequency-modulated partial waves. The positive threshold level is identified with reference numeral 27, whereas the negative threshold level is identified with reference numeral 28. The frequency disturbance deviation peaks 30 are detected, in accordance with the basic features of the present invention, with the aid of a wide-band operating (FM) frequency demodulator 1. As a rule, the bandwidth of the FM-demodulator 1, which is formed mainly as a ratio detector, is selected only so large that the linear demodulation region encopasses only the bandwidth corresponding to the maximum frequency deviation which takes place in the baseband signal. The FM demodulator 1 is supplied with an intermediate frequency signal 21 and delivers an output signal 22.

Such a narrow-band frequency demodulator is not in the position to evaluate the peaks of the frequency disturbance deviation such as, for example, that identified with reference numeral 30 in FIG. 3. The conventionally used ratio detector cuts off these peaks, so that only distorted signal contents located within the frequency region of the baseband appear at its output and distorts the overall contents. These distortions in the baseband signal disturb the reception and cannot be filtered out from the desired communication by technical means.

The present invention is based on a wide-band detection such that the frequency disturbance deviation peaks are fully formed at the output 22 of the FM demodulator 1 as disturbance signal peaks and are indicated by a subsequent evaluation circuit 2. Advantageously, the frequency demodulator of the detector has, for this purpose, a bandwidth which corresponds to the channel bandwidth of the intermediate frequency channel, and a control characteristic line whose controlling region in which the output signal increases with the increasing frequency deviation from the carrier frequency extends over the entire bandwidth of the intermediate frequency channel. It is evident that a detection of the frequency disturbance deviation peaks is basically possible even with smaller bandwidth and control regions of frequency demodulators. In each case it is, however, required that the controlling region of such a demodulator be selected considerably greater than that corresponding to the maximum effective deviation of the baseband signal.

The output signal 22 of the FM demodulator 1 is supplied to the evaluation circuit 2. In the evaluation circuit 2, the peaks are separated with the aid of a unipolar or bipolar operating level discriminator 7 or 3, from the useful signal whose maximum frequency deviation is known. The threshold of the level discriminator is adjusted so as to be suitable for this purpose and can be adjusted in a special embodiment of the invention in dependence on the time-averaged frequency deviation. In the event of exceeding the adjusted level threshold, a frequency disturbance deviation peak takes place. The output signal 23 of the level discriminator 3 is supplied to a binary operating logic circuit 4, and the presence of a reception disturbance is indicated at the output of the logic circuit with the aid of a binary signal 24. Frequency disturbance deviation peaks have as a rule a positive or negative polarity. In an advantageous embodiment of the invention both the positive and the negative frequency disturbance deviation peaks are evaluated. For this purpose it is required to use a bipolar level discriminator 3 with a positive and a negative level threshold for indicating the exceeding of a permissible frequency disturbance deviation.

Figure 4:
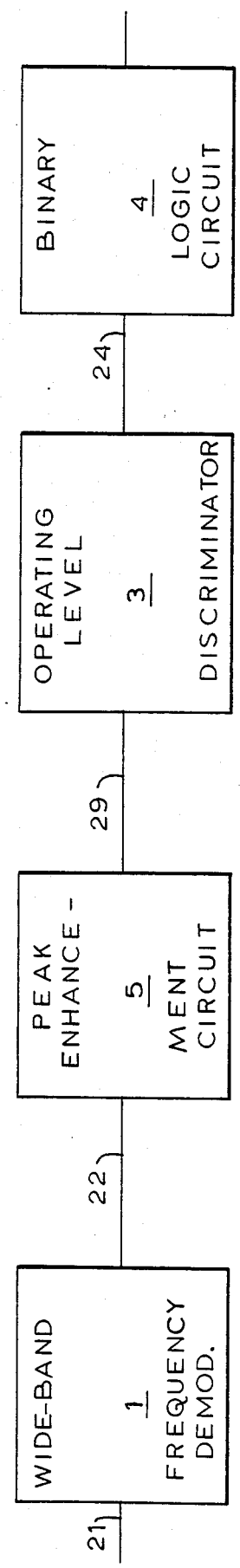
FIG. 4 is a view showing an embodiment of a detector with a circuit increasing the steepness of the pulse flanks.
Figure 6:
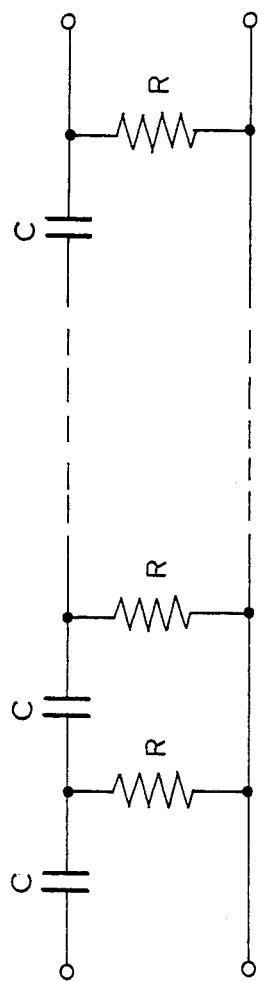
Figure 5:
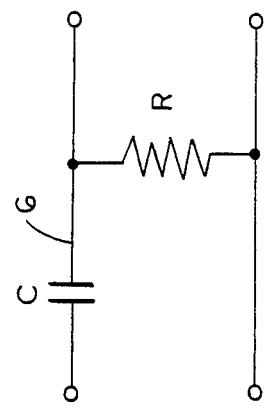
FIG. 5 is a view showing an embodiment of the circuit which increases the steepness of the pulse flanks (differentiating member)
Figure 7:
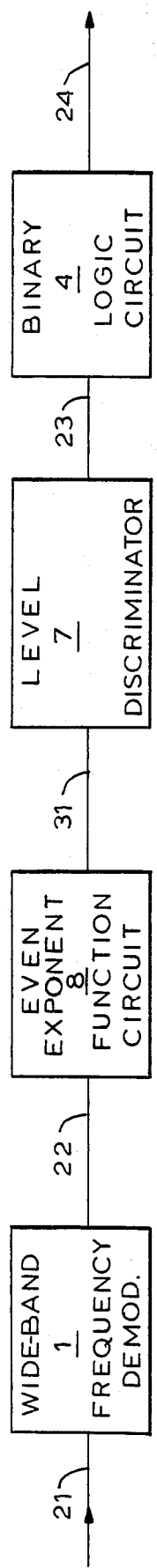
FIG. 7 is a view showing an embodiment of the detector in accordance with the present invention with a circuit increasing the steepness of the pulse flank in accordance with an even exponent function and with a unipolar level discriminator and a logical circuit.

For the sake of a reliable recognition of the frequency disturbance deviation peaks and thereby the disturbance caused by the multipath reception, these peaks, in accordance with an advantageous embodiment of the invention, are enhanced with the aid of a circuit 5 which increases the steepness of the pulse flanks (FIG. 4). The circuit 5 receives the output signal 22 from the FM demodulator 1 and delivers the processed output signal 29. The disturbance peaks thereby rise even higher from the useful signal and they can be indicated by the level discriminator 3 with an improved reliability. In accordance with an advantageous embodiment of the invention, the circuit 5 which increases the steepness of the pulse flanks includes a C-R-differentiating member 6 shown in FIG. 5. A chain of such a differentiating members 6 in accordance with FIG. 6 allows a further increase is the frequency disturbance deviation peaks and thereby an increase of the reliability of the disturbance recognition.

The circuit for increasing the steepness of the pulse flanks can be formed in a known manner by diode and transistor circuits so that the output signal 29 is a exponential function of the input signal 22. The exponential function of the current-voltage relation of a semiconducting diode or of the base-emitter diode of a transistor can be used here in a known manner.

Figure 8:
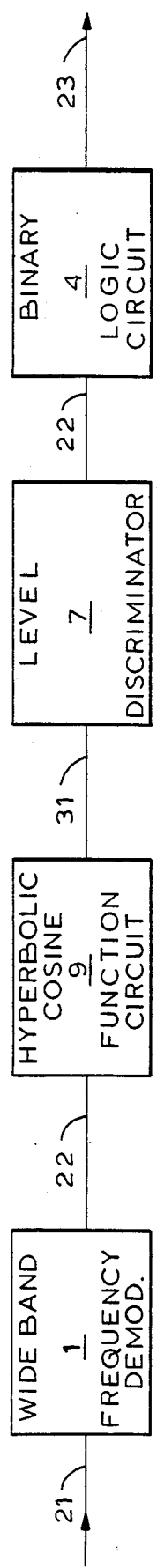
FIG. 8 is a view showing an embodiment of the detector in accordance with the present invention with a circuit increasing the steepness of the pulse flanks in accordance with a hyperbolic cosine function and with a unipolar level discriminator and a logical circuit.
Figure 9:
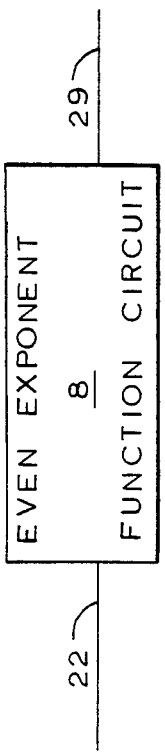
FIG. 9 is a view showing a circuit increasing the steepness of the pulse flanks (even-numbered exponent function).

In accordance with a special embodiment of the invention a circuit 8 so forms, this exponential function constituting the relation between the output and the input signal that it is an even function. Advantageously, this even function is an exponential function with an exponent which is an even number greater than 1, or a sum of such exponential functions with equal signs. In this case, disturbance peaks with equal polarity are present at an output 31 of this circuit. The level discriminator 7 which is necessary for this operates unipolarly. In a special embodiment of the invention, the circuit 8 for increasing the steepness of the pulse flanks is replaced, as shown in FIG. 8, by a circuit 9 which operates in such a manner that, with respect to the relation between the output signal 31 and the input signal 22, a function of the shape of a hyperbolic-cosine function is formed. A circuit with such a characteristic can be formed advantageously of two antiparallel controlled bipolar type transistors in a known manner. Also, the circuit can be composed of antiparallel semiconductive diodes. Reference numeral 29 identifies the processed signal as an output signal of the circuit 31 for increasing the steepness of the pulse flanks, having the shape of output peaks of the same polarity.

In the reception fields with smaller average high frequency amplitude, the reception is many times distorted by noise. This noise leads to relatively high frequency disturbance deviations. The above described detector recognizes, in addition to the frequency disturbance deviation peaks which are caused by time-delayed multiple path reception, even noise disturbances. In accordance with a special embodiment of the invention, in order to avoid faulty indications, the level threshold is dynamically adjusted in dependence on the time-averaged carrier amplitude at the reception point. In the event of too small a reception level, the threshold level in the level discriminator is increased.

It will be understood that each of the elements described above, or two or more together, may also find a useful application in other types of constructions differing from the types described above.

While the invention has been illustrated and described as embodied in a detector for indicating reception disturbances, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A detector for indicating reception disturbances during ultrashort waves broadcast reception by demodulation of a frequency modulated intermediate frequency signal which includes an intermediate frequency carrier that is frequency modulated with a baseband signal, comprising a frequency demodulator for the intermediate frequency signal, having such a demodulation characteristic line that a controlling region within which an output signal increases with increasing frequency deviation from the intermediate frequency carrier has a bandwidth which is significantly greater than a maximum frequency deviation of the frequency modulated intermediate frequency signal from the intermediate frequency carrier; and an evaluating circuit receiving the output signal of said demodulator and operative for indicating at an output thereof an exceeding of a predetermined frequency disturbance deviation threshold by a logic signal.

2. A detector as defined in claim 1, wherein said level discriminator of said evaluating circuit is formed as a unipolarly operating level discriminator.

3. A detector as defined in claim 1, wherein said evaluating circuit includes a level discriminator and a logic circuit and has a level threshold which is adjustable for indicating the exceeding of a predetermined frequency disturbance deviation, said evaluating circuit being formed so that the output signal of said level discriminator is supplied to said logic circuit and the presence of the reception disturbance is indicated at an output of said logic circuit by a binary signal.

4. A detector as defined in claim 3, wherein said level discriminator of said evaluating circuit is formed as a bipolarly operating level discriminator.

5. A detector as defined in claim 3, wherein said evaluating circuit has an input; and further comprising a circuit for increasing the steepness of pulse flanks provided at said input of said evaluating circuit and producing a processed output signal which is supplied to said level discriminator.

6. A detector as defined in claim 5, wherein said circuit for increasing the steepness of the pulse flanks has a differentiating member which includes a series capacity C and a parallel resistance R and has a time constant RC adjusted so as to obtain a reliable separation of shorter duration disturbance deviation pulses from longer duration working deviation pulses.

7. A detector as defined in claim 6, wherein said circuit for increasing the steepness of the pulse flanks includes a plurality of differentiating members connected with one another in a chain.

8. A detector as defined in claim 1, wherein said evaluating circuit includes a unipolarly operating level discriminator and a logic circuit arranged so that said level discriminator has only one level threshold and said level threshold is adjusted for indicating the exceeding of a predetermined positive and negative frequency disturbance deviation and an output signal of said level discriminator is supplied to said logic circuit at whose output the presence of the reception disturbance is indicated by a binary signal.

9. A detector as defined in claim 8, wherein said evaluating circuit has an input; and further comprising a circuit for increasing the steepness of pulse flanks arranged at said input of said evaluating circuit and formed so as to convert input impulses with different polarity into output impulses with identical polarity and to supply the thus processed signal to said level discriminator.

10. A detector as defined in claim 9, wherein said circuit for increasing the steepness of the pulse flanks is formed so that the relation between output and input signals thereof is an exponent function with even-numbered exponents.

11. A detector as defined in claim 9, wherein said circuit for increasing the steepness of the pulse flanks is formed so that the relation between the output and input signals thereof is composed of a sum of exponential functions with identical signs and with exponents greater than the number 1.

12. A detector as defined in claim 9, wherein said circuit for increasing the steepness of the pulse flanks is formed so that the relation between the output and input signals thereof is formed as a function with the characteristic of a hyperbolic cosine function.

13. A detector as defined in claim 1, wherein said evaluating circuit includes a bipolarly operating level discriminator and a logic circuit arranged so that said level discriminator has a positive and a negative level threshold and these level thresholds are adjusted for indicating the exceeding of a predetermined positive and negative frequency disturbance deviation, and the output signal of said level discriminator is supplied to said logic circuit at whose output the presence of the reception disturbance is indicated by a binary signal.

14. A detector as defined in claim 1, wherein said evaluating circuit includes an adjustable threshold level discriminator having an input receiving the output signal of said demodulator and an output, and a logic circuit having an input connected to said output of said discriminator and an output carrying said logic signal; and further comprising means for averaging the carrier amplitude over time, and means for adjusting the threshold level of said discriminator in dependence on the time-averaged carrier amplitude obtained from said averaging means.

15. A detector as defined in claim 1, wherein said evaluating circuit includes a plurality of adjustable threshold level discriminators having an input receiving the output signal of said demodulator and an output, and a logic circuit having an input connected to said output of said discriminators and an output carrying said logic signal; and further comprising means for averaging the carrier amplitude over time, and means for adjusting the threshold level of said discriminators in dependence on the time-averaged carrier amplitude obtained from said averaging means.

16. A detector as defined in claim 1, wherein said evaluating circuit includes an adjustable threshold level discriminator having an input receiving the output signal of said demodulator and an output, and a logic circuit having an input connected to said output of said discriminator and an output carrying said logic signal; and further comprising means for averaging the frequency deviation over time, and means for adjusting the threshold level of said discriminator in dependence on the time-averaged frequency deviation obtained from said averaging means.

17. A detector as defined in claim 1, wherein said evaluating circuit includes a plurality of adjustable threshold level discriminators having an input receiving the output signal of said demodulator and an output, and a logic circuit having an input connected to said output of said discriminators and an output carrying said logic signal; and further comprising means for averaging the frequency deviation over time, and means for adjusting the threshold level of said discriminators in dependence on the time-averaged frequency deviation obtained from said averaging means.

18. A detector as defined in claim 1, wherein said bandwidth of said controlling region extends substantially over the entire bandwidth of the intermediate frequency signal channel.

19. A detector for indicating reception disturbances during ultrashort waves broadcast reception by demodulation of a frequency modulated intermediate frequency signal which includes an intermediate frequency carrier that is frequency modulated with a baseband signal, comprising a frequency demodulator for the intermediate frequency signal, having such a demodulation characteristic line that a controlling region within which an output signal increases with increasing frequency deviation from the intermediate frequency carrier has a bandwidth which is significantly greater than a maximum frequency deviation of the frequency modulated intermediate frequency signal from the intermediate frequency carrier; an evaluating circuit receiving the output signal of said demodulator and including an adjustable bipolarly operating level discriminator having a positive and a negative level threshold and operative for indicating by an output signal an exceeding of a predetermined positive and negative frequency disturbance deviation, and a logic circuit supplied with said output signal of said level discriminator and operative for indicating at an output thereof the presence of the reception disturbance by a binary logic signal; means for averaging the carrier amplitude over time; and means connected to said averaging means and operative for adjusting the level threshold of said level discriminator in dependence on the time-averaged carrier amplitude.

20. A detector as defined in claim 19, wherein said level discriminator is formed so that with decreasing carrier amplitude the level threshold is increased.

21. A detector for indicating reception disturbances during ultrashort waves broadcast reception by demodulation of a frequency modulated intermediate frequency signal which includes an intermediate frequency carrier that is frequency modulated with a baseband signal, comprising a frequency demodulator for the intermediate frequency signal, having such a demodulation characteristic line that a controlling region within which an output signal increases with increasing frequency deviation from the intermediate frequency carrier has a bandwidth which is significantly greater than a maximum frequency deviation of the frequency modulated intermediate frequency signal from the intermediate frequency carrier; an evaluating circuit receiving the output signal of said demodulator and including a plurality of adjustable bipolarly operating level discriminators each of which has a positive and a negative level threshold and is operative for indicating by an output signal an exceeding of a predetermined positive and negative frequency disturbance deviation, and a logic circuit supplied with said output signal of said level discriminators and operative for indicating at an output thereof the presence of the reception disturbance by a binary logic signal; means for averaging the carrier amplitude over time; and means connected to said averaging means and operative for adjusting the threshold level of said level discriminators in dependence on the time-averaged carrier amplitude.

22. A detector for indicating reception disturbances during ultrashort waves broadcast reception by demodulation of a frequency modulated intermediate frequency signal which includes an intermediate frequency carrier that is frequency modulated with a baseband signal, comprising a frequency demodulator for the intermediate frequency signal, having such a demodulation characteristic line that a controlling region within which an output signal increases with increasing frequency deviation from the intermediate frequency carrier has a bandwidth which is significantly greater than a maximum frequency deviation of the frequency modulated intermediate frequency signal from the intermediate frequency carrier; an evaluating circuit receiving the output signal of said demodulator and including an adjustable bipolarly operating level discriminator having a positive and a negative level threshold and operative for indicating by an output signal an exceeding of a predetermined positive and negative frequency disturbance deviation, and a logic circuit supplied with said output signal of said level discriminator and operative for indicating at an output thereof the presence of the reception disturbance by a binary logic signal; means for averaging the frequency deviation over time; and means connected to said averaging means and operative for dynamically adjusting the level threshold of said level discriminator in dependence on the time-averaged frequency deviation.

23. A detector for indicating reception disturbances during ultrashort waves broadcast reception by demodulation of a frequency modulated intermediate frequency signal which includes an intermediate frequency carrier that is frequency modulated with a baseband signal, comprising a frequency demodulator for the intermediate frequency signal, having such a demodulation characteristic line that a controlling region within which an output signal increases with increasing frequency deviation from the intermediate frequency carrier has a bandwidth which is significantly greater than a maximum frequency deviation of the frequency modulated intermediate frequency signal from the intermediate frequency carrier; an evaluating circuit receiving the output signal of said demodulator and including a plurality of adjustable bipolarly operating level discriminators each of which has a positive and a negative level threshold and is operative for indicating by an output signal an exceeding of a predetermined positive and negative frequency disturbance deviation, and a logic circuit supplied with said output signal of said level discriminators and operative for indicating at an output thereof the presence of the reception disturbance by a binary logic signal; means for averaging the frequency deviation over time; and means connected to said averaging means and operative for dynamically adjusting the level threshold of said level discriminators in dependence on the time-averaged frequency deviation.

* * * * *